(12) United States Patent
Park et al.

(10) Patent No.: US 10,141,376 B2
(45) Date of Patent: Nov. 27, 2018

(54) ORGANIC PHOTOELECTRONIC DEVICE AND IMAGE SENSOR

(71) Applicant: Samsung Electronics Co., Ltd., Suwon-si, Gyeonggi-do (KR)

(72) Inventors: Kyung Bae Park, Hwaseong-si (KR); Satoh Ryuichi, Numazu-si (JP); Gae Hwang Lee, Seongnam-si (KR); Kwang Hee Lee, Hwaseong-si (KR); Dong-Seok Leem, Hwaseong-si (KR); Yong Wan Jin, Seoul (KR); Tadao Yagi, Hwaseong-si (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 7 days.

(21) Appl. No.: 15/593,631

(22) Filed: May 12, 2017

(65) Prior Publication Data

US 2017/0250227 A1 Aug. 31, 2017

Related U.S. Application Data

(63) Continuation of application No. 14/604,185, filed on Jan. 23, 2015, now Pat. No. 9,673,259.

(30) Foreign Application Priority Data

Jul. 16, 2014 (KR) ........................ 10-2014-0089914

(51) Int. Cl.
*H01L 27/30* (2006.01)
*H01L 51/00* (2006.01)
(Continued)

(52) U.S. Cl.
CPC ............ *H01L 27/307* (2013.01); *H01L 27/30* (2013.01); *H01L 27/302* (2013.01);
(Continued)

(58) Field of Classification Search
CPC ..... H01L 33/06; H01L 33/502; H01L 25/167; H01L 33/24
See application file for complete search history.

(56) References Cited

U.S. PATENT DOCUMENTS 7,655,306 B2 2/2010 Lee et al.
9,379,343 B2 6/2016 Leem et al.
(Continued)

FOREIGN PATENT DOCUMENTS

CN 101078792 A 11/2007
CN 101261332 A 9/2008
(Continued)

OTHER PUBLICATIONS

European Search Report dated Dec. 8, 2015.
(Continued)

*Primary Examiner* — Marc Armand
*Assistant Examiner* — Quinton Brasfield
(74) *Attorney, Agent, or Firm* — Harness, Dickey & Pierce, P.L.C.

(57) ABSTRACT

Example embodiments relate to an organic photoelectronic device that includes a first electrode, a light-absorption layer on the first electrode and including a first p-type light-absorption material and a first n-type light-absorption material, a light-absorption auxiliary layer on the light-absorption layer and including a second p-type light-absorption material or a second n-type light-absorption material that have a smaller full width at half maximum (FWHM) than the FWHM of the light absorption layer, a charge auxiliary layer on the light-absorption auxiliary layer, and a second electrode on the charge auxiliary layer, and an image sensor including the same.

20 Claims, 8 Drawing Sheets

(51) Int. Cl.
*H01L 51/42* (2006.01)
*H01L 51/44* (2006.01)
*H01L 25/16* (2006.01)
*H01L 33/06* (2010.01)

(52) U.S. Cl.
CPC ........ *H01L 51/008* (2013.01); *H01L 51/0094* (2013.01); *H01L 51/424* (2013.01); *H01L 51/4246* (2013.01); *H01L 51/4253* (2013.01); *H01L 51/442* (2013.01); *H01L 51/447* (2013.01); *H01L 25/167* (2013.01); *H01L 33/06* (2013.01); *H01L 51/0046* (2013.01); *H01L 51/0068* (2013.01); *H01L 51/44* (2013.01); *Y02E 10/549* (2013.01)

(56) References Cited

U.S. PATENT DOCUMENTS

| | | |
|---|---|---|
| 2005/0205903 A1 | 9/2005 | Hioki |
| 2006/0027801 A1 | 2/2006 | Forrest et al. |
| 2008/0219011 A1 | 9/2008 | Sin et al. |
| 2009/0179291 A1* | 7/2009 | Nam ............... H01L 27/14647 257/440 |
| 2010/0025665 A1 | 2/2010 | Rand et al. |
| 2011/0253992 A1 | 10/2011 | Rand et al. |
| 2012/0216870 A1 | 8/2012 | So et al. |
| 2014/0070189 A1* | 3/2014 | Leem ............... H01L 51/442 257/40 |
| 2014/0097416 A1* | 4/2014 | Lee ............... H01L 51/008 257/40 |
| 2014/0160327 A1 | 6/2014 | Enoki et al. |

FOREIGN PATENT DOCUMENTS

| | | |
|---|---|---|
| CN | 103682150 A | 3/2014 |
| JP | 2009538529 A | 11/2009 |
| JP | 2010182720 A | 8/2010 |
| KR | 20100090898 A | 8/2010 |
| WO | WO-2010134432 A1 | 11/2010 |

OTHER PUBLICATIONS

CAS Registry, XP55232087, C:\EPODATA\SEA\eplogf\EP15162784.log, Nov. 27, 2015, p. 1.
Cate, Michael C., "Kinetics of the Ligand Exchange Restrictions Between Bidentate Ligands and Triethylenetramine Nickelate (II) and Synthesis of Boron (III) Subphathalocyanines with Various Boron Substitutions Recommended Citations," XP055232007, Digital Commons@EMU, URL: <http://commons.emich.edu/cgi/viewcontent.cgi?article=1042&context=theses>, Nov. 27, 2015, p. 1-88.
Claessens, Christian G. et al, "Subphthalocyanines, Subporphyrazines, and Subporphyrins: Singular Nonplanar Aromatic Systems," Chemical Reviews, vol. 114, No. 4, Feb. 26, 2014, pp. 2192-2277.
Lin, Chi-Feng et al., "Chloroboron subphthalocyanine/C60 planar heterojunction organic solar cell with N, N-dicarbazolyl-3, 5-benzene blocking layer," Solar Energy Materials and Solar Cells, Elsevier Science Publishers, Amsterdam, NL, vol. 122, Jan. 3, 2014, pp. 264-270.
Lessard, Benoît H. et al., "Bis(tri-n-hexylsilyl oxide) Silicon Phthalocyanine: A Unique Additive in Ternary Bulk Heterojunction Organic Photovoltaic Devices," American Chemical Society—Applied Materials & Interfaces, vol. 6, Aug. 22, 2014, pp. 15040-15051.
Extended European Search report dated Jan. 26, 2016.
Chinese Office Action dated May 30, 2018 for corresponding Chinese Patent Application No. 201510122544.X.

* cited by examiner

ORGANIC PHOTOELECTRONIC DEVICE AND IMAGE SENSOR

This application is a continuation of U.S. application Ser. No. 14/604,185 filed on Jan. 23, 2015, which claims the benefit of priority to Korean Patent Application No. 10-2014-0089914 filed in the Korean Intellectual Property Office on Jul. 16, 2014, the entire disclosure of each of which are incorporated herein by reference.

BACKGROUND

1. Field

Example embodiments relate to an organic photoelectronic device and an image sensor.

2. Description of the Related Art

A photoelectronic device typically converts light into an electrical signal using photoelectronic effects, may include a photodiode, a phototransistor, and the like, and may be applied to an image sensor, a solar cell, and the like.

An image sensor including a photodiode requires high resolution and thus a small pixel. At present, silicon photodiodes are widely used, but typically exhibit deteriorated sensitivity because of a small absorption area due to small pixels. Accordingly, an organic material that is capable of replacing silicon has been researched.

Accordingly, an organic material that is capable of replacing silicon may have a high extinction coefficient, or light absorption power, and may selectively absorb light in a particular wavelength region depending on a molecular structure, and thus may replace both a photodiode and a color filter. As a result, the organic material may have an improved sensitivity and may contribute to higher device integration.

SUMMARY

At least one example embodiment relates to an organic photoelectronic device capable of improving wavelength selectivity due to improved spectral characteristics.

Another example embodiment relates to an image sensor including the organic photoelectronic device.

According to at least one example embodiment, an organic photoelectronic device includes a first electrode, a light-absorption layer on the first electrode and including a first p-type light-absorption material and a first n-type light-absorption material, a light-absorption auxiliary layer on the light-absorption layer and including a second p-type light-absorption material or a second n-type light-absorption material having a smaller full width at half maximum (FWHM) than the light-absorption layer, a charge auxiliary layer on the light-absorption auxiliary layer; and a second electrode on the charge auxiliary layer.

The light-absorption layer and the light-absorption auxiliary layer may contact each other.

The second electrode may be disposed at a side where light enters.

The second p-type light-absorption material or the second n-type light-absorption material may have a smaller FWHM than the FWHM of the light-absorption layer by about 5 nm or more.

External quantum efficiency (EQE) of the second p-type light-absorption material or the second n-type light-absorption material at a maximum absorption wavelength ($\lambda_{max}$) may be the same as or higher than external quantum efficiency (EQE) of the light-absorption layer at a maximum absorption wavelength ($\lambda_{max}$).

The FWHM of light-absorption layer may be wider than the FWHM of the first p-type light-absorption material or the first n-type light-absorption material.

The second p-type light-absorption material may be the same as or different from the first p-type light-absorption material, and the second n-type light-absorption material may be the same as or different from the first n-type light-absorption material.

The second p-type light-absorption material or the second n-type light-absorption material may be represented by the following Chemical Formula 1.

[Chemical Formula 1]

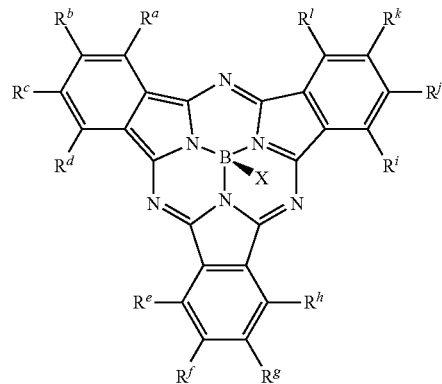

In the above Chemical Formula 1, $R^a$ to $R^l$ may be independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and X may be a halogen atom, a halogen-containing group, a substituted or unsubstituted C1 to C30 alkyl group, a substituted or unsubstituted C6 to C30 aryl group, a substituted or unsubstituted C1 to C30 alkoxy group, a substituted or unsubstituted C1 to C30 aryloxy group, a substituted or unsubstituted C1 to C30 heteroaryloxy group, a substituted or unsubstituted silyloxy group, a substituted or unsubstituted amine group, a substituted or unsubstituted arylamine group, or a combination thereof.

The second p-type light-absorption material may be the same as or different from the first p-type light-absorption material, and the second n-type light-absorption material may be the same as or different from the first n-type light-absorption material.

The first p-type light-absorption material or the first n-type light-absorption material may be represented by the following Chemical Formula 2.

[Chemical Formula 2]

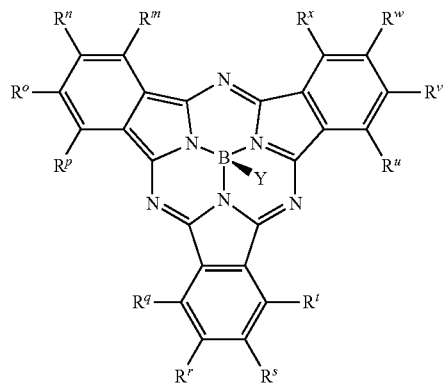

In the above Chemical Formula 2,

R$^m$ to R$^x$ may be independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and Y is a halogen atom.

The light-absorption layer and the light-absorption auxiliary layer may absorb light in a green wavelength region.

The light-absorption auxiliary layer may have a FWHM of less than or equal to about 90 nm.

The charge auxiliary layer may not substantially absorb light in a visible wavelength region.

The first electrode and the second electrode may be a transparent electrode, respectively.

According to another example embodiment, an image sensor including the organic photoelectronic device is provided.

The image sensor may include a semiconductor substrate integrated with a plurality of first photo-sensing devices configured to sense light in a blue wavelength region and a plurality of second photo-sensing devices configured to sense light in a red wavelength region, and the organic photoelectronic device is on the semiconductor substrate and is configured to selectively absorb light in a green wavelength region.

The image sensor may further include a color filter layer including a blue filter configured to selectively absorb light in a blue wavelength region and a red filter that is configured to selectively absorb light in a red wavelength region. The color filter layer may be positioned between the semiconductor substrate and the organic photoelectronic device.

The first photo-sensing device and the second photo-sensing device may be stacked.

The image sensor may include a green photoelectronic device that is the organic photoelectronic device, a blue photoelectronic device configured to selectively absorb light in a blue wavelength region, and a red photoelectronic device configured to selectively absorb light in a red wavelength region. The green photoelectronic device, the blue photoelectronic device, and a red photoelectronic device may be stacked.

According to yet another example embodiment, an electronic device including the image sensor is provided.

According to at least one example embodiment, an organic photoelectronic device includes a first electrode, a light-absorption layer on the first electrode, a light-absorption auxiliary layer on the light absorption layer and having a smaller full width at half maximum (FWHM) than the light-absorption layer, a charge auxiliary layer on the light-absorption auxiliary layer, and a second electrode on the charge auxiliary layer.

DETAILED DESCRIPTION

Figure 1:
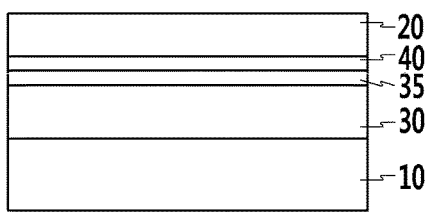
FIG. 1 is a cross-sectional view showing an organic photoelectronic device according to at least one example embodiment.

Example embodiments will hereinafter be described in detail, and may be easily performed by those who have common knowledge in the related art.

However, this disclosure may be embodied in many different forms and is not construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

As used herein, when a definition is not otherwise provided, the term "substituted" refers to one substituted with a substituent being one of a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when a specific definition is not otherwise provided, the term "hetero" refers to one including 1 to 3 heteroatoms from N, O, S, and P.

In the drawings, parts having no relationship with the description are omitted for clarity of the embodiments, and the same or similar constituent elements are indicated by the same reference numerals throughout the specification.

Hereinafter, the term 'combination' refers to a mixture and/or a stacking structure of two or more thereof.

Hereinafter, referring to the drawings, an organic photoelectronic device according to at least one example embodiment is described.

FIG. 1 is a cross-sectional view showing an organic photoelectronic device according to at least one example embodiment.

Referring to FIG. 1, an organic photoelectronic device 100 according to at least one example embodiment includes a first electrode 10, a light-absorption layer 30 on the first electrode 10, a light-absorption auxiliary layer 35 on the light-absorption layer 30, a charge auxiliary layer 40 on the light-absorption auxiliary layer 35, and a second electrode 20 on the charge auxiliary layer 40. According to at least one example embodiment, one of the first electrode 10 and the second electrode 20 is an anode and the other is a cathode. At least one of the first electrode 10 and the second electrode 20 may be a light-transmitting electrode, and the light-transmitting electrode may be made of or include, for example, a transparent conductor such as indium tin oxide (ITO) or indium zinc oxide (IZO), or a metal thin layer of a thin monolayer or multilayer. When one of the first electrode 10 and the second electrode 20 is a non-light-transmitting electrode, the non-light-transmitting electrode may be made of or include, for example, an opaque conductor such as aluminum (Al).

For example, the second electrode 20 may be or include a light-transmitting electrode.

For example, the first electrode 10 and the second electrode 20 may be or include light-transmitting electrodes.

The light-absorption layer 30 may include a first p-type light-absorption material and a first n-type light-absorption material, and may be configured to absorb light externally to generate excitons and then to separate the generated excitons into holes and electrons.

At least one of the first p-type light-absorption material and the first n-type light-absorption material may be or include an organic material, and for example both the first p-type light-absorption material and the first n-type light-absorption material may be or include organic materials.

The light-absorption layer 30 may include an intrinsic layer (I layer) including the first p-type light-absorption material and the first n-type light-absorption material, and may be, for example formed by co-deposition and the like. In the intrinsic layer, the first p-type light-absorption material and the first n-type light-absorption material may form a heterojunction (bulk heterojunction).

The intrinsic layer may include the first p-type light-absorption material and the first n-type light-absorption material in a thickness ratio of about 1:100 to about 100:1. Within the range, they may be included in a thickness ratio of about 1:50 to about 50:1, about 1:10 to about 10:1, or about 1:1. When the first p-type light-absorption material and the first n-type light-absorption material have a composition ratio within the range, an exciton may be more effectively produced and a pn junction may be more effectively formed.

The light-absorption layer 30 may be a multilayer including the first p-type light-absorption material, the first n-type light-absorption material, or a combination thereof. The light-absorption layer 30 may be or include various combinations, for example, a p-type layer/n-type layer, a p-type layer/I layer, an I layer/n-type layer, and a p-type layer/I layer/n-type layer. The p-type layer may include the first p-type light-absorption material and the n-type layer may include the first n-type light-absorption material.

The first p-type light-absorption material and the first n-type light-absorption material may be configured to absorb light in a visible wavelength region, and at least one of the first p-type light-absorption material and the first n-type light-absorption material may be configured to selectively absorb light having a desired, or alternatively predetermined wavelength region of a visible wavelength region. For example, at least one of the first p-type light-absorption material and the first n-type light-absorption material may be configured to selectively absorb light in a green wavelength region, and the light in the green wavelength region may have a maximum absorption wavelength ($\lambda_{max}$) of about 500 nm to about 600 nm.

In the light-absorption layer 30, a full width at half maximum (FWHM) indicates a selective absorption degree of light having a desired, or alternatively predetermined wavelength region. Herein, the FWHM is a width of a wavelength corresponding to a half of maximum external quantum efficiency (EQE) in an external quantum efficiency (EQE) graph. A small FWHM indicates selective absorption of light in a narrow wavelength region and high wavelength selectivity, and a large FWHM indicates absorption of light in a wide wavelength region and low wavelength selectivity.

The first p-type light-absorption material and the first n-type light-absorption material may have different spectrum profiles, and may have different FWHMs. The light-absorption layer 30 has a combined spectrum profile of each spectrum profile of the first p-type light-absorption material and the first n-type light-absorption material, and a FWHM of the light-absorption layer 30 may be wider than the FWHM of the first p-type light-absorption material or the first n-type light-absorption material.

The first p-type light-absorption material or the first n-type light-absorption material may be or include, for example, a compound represented by the following Chemical Formula 2, but is not limited thereto.

[Chemical Formula 2]

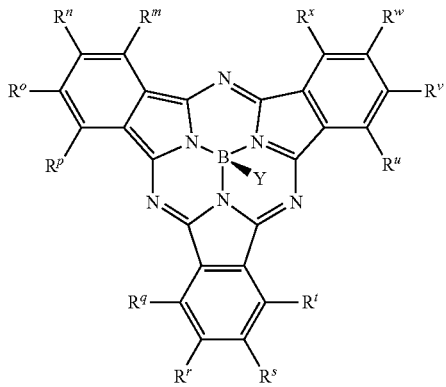

In the Chemical Formula 2,
$R^m$ to $R^x$ may be independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and
Y may be a halogen atom.
Y may be, for example, a fluorine atom or a chlorine atom.

For example, the compound represented by the Chemical Formula 2 may be used as the first p-type light-absorption material, and the first n-type light-absorption material may be or include, for example, a thiophene derivative such as dicyanovinyl-terthiophene (DCV3T), fullerene, a fullerene derivative, or an imide compound such as perylene diimide, but is not limited thereto.

For example, when the compound represented by the Chemical Formula 2 is used as the first n-type light-absorption material, the first p-type light-absorption material may be or include, for example, N,N'-dimethylquinacridone (DMQA), N,N'-dimethyl-2,9-dimethylquinacridone (DM-MQA), and the like, but is not limited thereto.

The light-absorption layer 30 may be configured to selectively absorb light in a green wavelength region.

The light-absorption layer 30 may have a thickness of about 1 nm to about 500 nm, and for example, about 5 nm to about 300 nm. When the light-absorption layer 30 has a thickness within the above ranges, the light-absorption layer may more effectively absorb light, more effectively separate holes from electrons, and deliver the holes, thereby more effectively improving photoelectric conversion efficiency.

The light-absorption auxiliary layer 35 may contact the light-absorption layer 30, and may include a second p-type light-absorption material or a second n-type light-absorption material.

For example, when the first electrode 10 is a cathode and the second electrode 20 is an anode, the light-absorption auxiliary layer 35 may include the second p-type light-absorption material, and when the first electrode 10 is an anode and the second electrode 20 is a cathode, the light-absorption auxiliary layer 35 may include the second n-type light-absorption material. The second p-type light-absorption material may be the same as or different from the first p-type light-absorption material, and the second n-type light-absorption material may be the same as or different from the first n-type light-absorption material.

The second p-type light-absorption material or the second n-type light-absorption material may be selected from materials having smaller FWHMs than the light-absorption layer 30.

As described above, because the light-absorption layer 30 has a combined spectrum profile of each spectrum profile of the first p-type light-absorption material and the first n-type light-absorption material, FWHM of the light-absorption layer 30 may be wider than the FWHM of the first p-type light-absorption material or the first n-type light-absorption material, and therefore the light-absorption layer 30 has lower wavelength selectivity than the first p-type light-absorption material or the first n-type light-absorption material.

In at least one example embodiment, the second p-type light-absorption material having a smaller FWHM than the light-absorption layer 30 or the light-absorption auxiliary layer 35 having the second n-type light-absorption material may be disposed to be nearer to the electrode where light enters than the light-absorption layer 30, and thereby wavelength selectivity of the light-absorption layer 30 may be compensated.

For example, the second p-type light-absorption material or the second n-type light-absorption material may have a smaller FWHM than the FWHM of the light-absorption layer 30 by about 5 nm or more. Within this range, the second p-type light-absorption material or the second n-type light-absorption material may have a smaller FWHM than the FWHM of the light-absorption layer 30 by about 5 nm to about 50 nm, specifically about 10 nm to about 50 nm, and more specifically about 10 nm to about 30 nm.

The light-absorption auxiliary layer 35 may have, for example an extinction coefficient that is greater than or equal to about 100,000 cm$^{-1}$, and specifically about 120,000 to 200,000 cm$^{-1}$ at a maximum absorption wavelength ($\lambda_{max}$).

The light-absorption auxiliary layer 35 may have, for example, an external quantum efficiency graph that is less than or equal to about 90 nm, for another example, about 30 nm to 90 nm, and for another example, about 50 nm to about 90 nm.

The light-absorption auxiliary layer 35 may maintain or improve photoelectric conversion efficiency of the light-absorption layer 30, and therefore maximum external quantum efficiency (EQE$_{max}$) of the second p-type light-absorption material or the second n-type light-absorption material may be the same as or higher than the maximum external quantum efficiency (EQE$_{max}$) of the light-absorption layer 30. For example, the maximum external quantum efficiency (EQE$_{max}$) of the second p-type light-absorption material or the second n-type light-absorption material may be higher than the maximum external quantum efficiency (EQE$_{max}$) of the light-absorption layer 30 by about 0% to about 30%, for example, by about 0.1% to about 30%, and for another example, by about 1% to about 30%.

For example, the second p-type light-absorption material or the second n-type light-absorption material may be represented by the following Chemical Formula 1, but is not limited thereto.

[Chemical Formula 1]

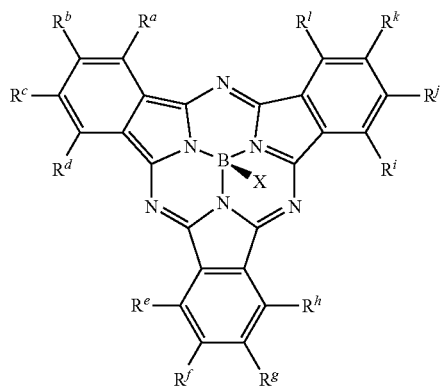

In the Chemical Formula 1, $R^a$ to $R^l$ may be independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and X may be a halogen atom, a halogen-containing group, a substituted or unsubstituted C1 to C30 alkyl group, a substituted or unsubstituted C6 to C30 aryl group, a substituted or unsubstituted C1 to C30 alkoxy group, a substituted or unsubstituted C1 to C30 aryloxy group, a substituted or unsubstituted C1 to C30 heteroaryloxy group, a substituted or unsubstituted silyloxy group, a substituted or unsubstituted amine group, a substituted or unsubstituted arylamine group, or a combination thereof.

For example, Table 1 illustrates the extinction coefficient and FWHM, when in Chemical Formula 1, $R^a$ to $R^l$ are independently hydrogen and X is a group listed in the following Table 1.

TABLE 1

| X | Maximum absorption wavelength ($\lambda_{max}$) | Extinction coefficient (*10$^4$ cm$^{-1}$) | FWHM (nm) |
|---|---|---|---|
| Cl | 587 | 15 | 81 |
| F | 582 | 15 | 83 |
| ⌬–O–B | 581 | 14 | 69 |
| F$_5$C$_6$–O–B | 581 | 16 | 48 |
| 1-naphthyl-O–B | 579 | 12 | 62 |
| 2-naphthyl-O–B | 580 | 13 | 63 |

TABLE 1-continued

| X | Maximum absorption wavelength ($\lambda_{max}$) | Extinction coefficient ($*10^4$ cm$^{-1}$) | FWHM (nm) |
|---|---|---|---|
| 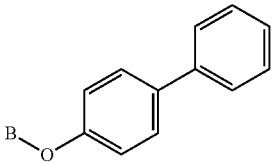 | 579 | 13 | 62 |
| 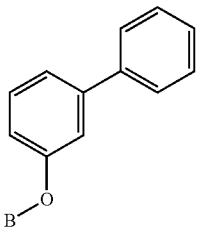 | 580 | 12 | 65 |
| 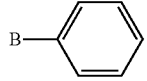 | 584 | 15 | 66 |
| 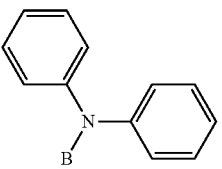 | 583 | 12 | 61 |
| 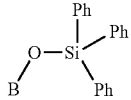 | 575 | 11 | 46 |
| 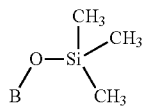 | 575 | 15 | 63 |
| 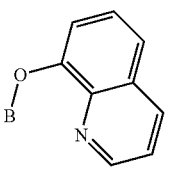 | 581 | 13 | 65 |

The light-absorption auxiliary layer 35 may be configured to selectively absorb light in a green wavelength region.

The light-absorption auxiliary layer 35 may have a thickness of about 1 nm to about 200 nm. Within the range, the light-absorption auxiliary layer 35 may have a thickness of about 5 nm to about 100 nm, and for example about 5 nm to about 70 nm.

The charge auxiliary layer 40 may be between the second electrode 20 and the light-absorption auxiliary layer 35, and may be configured to allow holes and electrons separated in the light-absorption layer 30 to easily transfer to the second electrode 20. The charge auxiliary layer 40 may not substantially absorb light in a visible wavelength region, and accordingly does not inhibit absorption of light in a visible wavelength region that enters the light-absorption auxiliary layer 35 and the light-absorption layer 30 from the side of the second electrode 20.

For example, when the first electrode 10 is a cathode and the second electrode 20 is an anode, the charge auxiliary layer 40 may be at least one of a hole injection layer (HIL) for facilitating hole injection, a hole transport layer (HTL) for facilitating hole transport, and an electron blocking layer (EBL) for preventing electron transport. When the first electrode 10 is an anode and the second electrode 20 is a cathode, the charge auxiliary layer 40 may be an electron injection layer (EIL) for facilitating electron injection, an electron transport layer (ETL) for facilitating electron transport, and a hole blocking layer (HBL) for preventing hole transport.

The charge auxiliary layer 40 may include, for example, an organic material, an inorganic material, or an organic/inorganic material. The organic material may be an organic compound having hole or electron characteristics, and the inorganic material may be or include, for example, a metal oxide such as molybdenum oxide, tungsten oxide, nickel oxide, and the like.

The hole transport layer (HTL) may include one of, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one of, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one of, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, and a combination thereof, but is not limited thereto.

The hole blocking layer (HBL) may include one of, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBQ$_2$, and a combination thereof, but is not limited thereto.

In the organic photoelectronic device 100, when light enters from the first electrode 10 and/or second electrode 20, and the light-absorption layer 30 and the light-absorption auxiliary layer 35 absorb light having a desired, or alternatively predetermined wavelength region, excitons may be produced from the inside. The excitons are separated into holes and electrons in the light-absorption layer 30 and the light-absorption auxiliary layer 35, the separated holes are transported to an anode that is one of the first electrode 10 and the second electrode 20, and the separated electrons are transported to the cathode that is the other of and the first electrode 10 and the second electrode 20, so as to flow a current in the organic photoelectronic device.

The organic photoelectronic device may be applied to various fields, for example a solar cell, an image sensor, a photo-detector, a photo-sensor, and an organic light emitting diode (OLED), but is not limited thereto.

Hereinafter, an example of an image sensor including the organic photoelectronic device is described referring to drawings. As an example of an image sensor, an organic CMOS image sensor is described.

Figure 2:
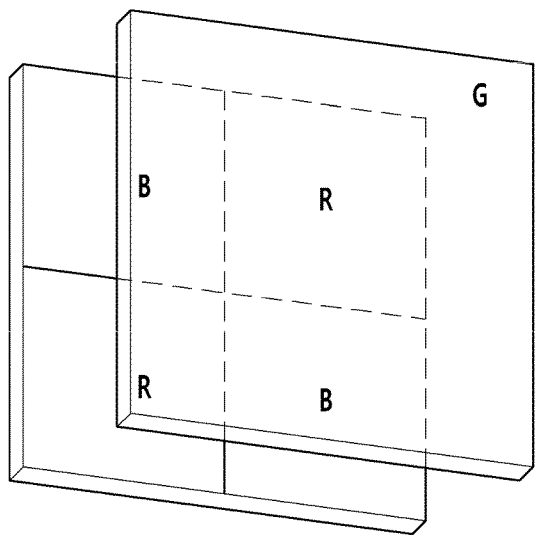
FIG. 2 is a schematic top plan view of an organic CMOS image sensor according to at least one example embodiment.
Figure 3:
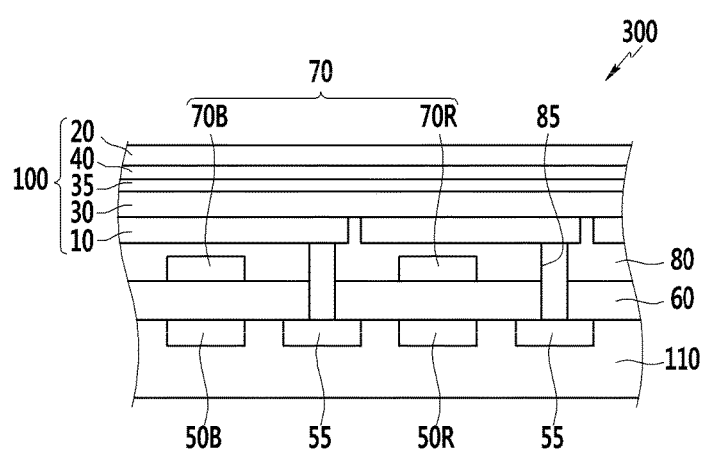
FIG. 3 is a cross-sectional view of the organic CMOS image sensor of FIG. 2.

FIG. 2 is a schematic top plan view of an organic CMOS image sensor according to at least one example embodiment, and FIG. 3 is a cross-sectional view of the organic CMOS image sensor of FIG. 2.

Referring to FIGS. 2 and 3, an organic CMOS image sensor 300 according to at least one example embodiment includes a semiconductor substrate 110 integrated with a blue photo-sensing device 50B, a red photo-sensing device 50R, a transmission transistor (not shown), and a charge storage 55, a lower insulation layer 60, a color filter layer 70, an upper insulation layer 80, and the organic photoelectronic device 100.

The semiconductor substrate 110 may be or include a silicon substrate, and may be integrated with the blue photo-sensing device 50B, the red photo-sensing device 50R, the transmission transistor (not shown), and the charge storage 55. The blue photo-sensing device 50B and the red photo-sensing device 50R may be or include photodiodes.

The blue photo-sensing device 50B, the red photo-sensing device 50R, the transmission transistor, and/or the charge storage 55 may be integrated in each pixel, and as shown in the drawing, the blue photo-sensing device 50B may be included in a blue pixel and the red photo-sensing device 50R may be included in a red pixel. The charge storage 55 is shown in only the green pixel, but the blue pixel and red pixel may also each include a charge storage connected with the blue photo-sensing device 50B and a charge storage connected with the red photo-sensing device 50R.

The blue photo-sensing device 50B and the red photo-sensing device 50R may be configured to sense light, the information sensed by the photo-sensing devices 50B and 50R may be transferred by the transmission transistor, the charge storage 55 of the green pixel may be electrically connected with the organic photoelectronic device 100 that will be described below, and the information of the charge storage 55 may be transferred by the transmission transistor.

A metal wire (not shown) and a pad (not shown) may be on the semiconductor substrate 110. In order to decrease signal delay, the metal wire and pad may be made of or include a metal having low resistivity, for example, aluminum (Al), copper (Cu), silver (Ag), and alloys thereof, but is not limited thereto. However, the metal wire and pad are not limited to the illustrated structure, and the metal wire and pad may be under the photo-sensing devices 50B and 50R.

The lower insulation layer 60 may be formed on the metal wire and the pad. The lower insulation layer 60 may be made of or include an inorganic insulating material such as a silicon oxide and/or a silicon nitride, or a low dielectric constant (low K) material such as SiC, SiCOH, SiCO, and SiOF. The lower insulation layer 60 may have a trench exposing the charge storage 55. The trench may be filled with fillers.

A color filter layer 70 may be on the lower insulation layer 60. The color filter layer 70 may include a blue filter 70B in the blue pixel and a red filter 70R in the red pixel. In an example embodiment, a green filter is not included, but a green filter may be further included.

The upper insulation layer 80 may be on the color filter layer 70. The upper insulation layer 80 may eliminate a step caused by the color filter layer 70 and may smoothen the surface. The upper insulation layer 80 and lower insulation layer 60 may include a contact hole (not shown) exposing a pad, and a through-hole 85 exposing the charge storage 55 of a green pixel.

The organic photoelectronic device 100 may be on the upper insulation layer 80. The organic photoelectronic device 100 may include the first electrode 10, the light-absorption layer 30, the light-absorption auxiliary layer 35, the charge auxiliary layer 40, and the second electrode 20 as described above.

The first electrode 10 and the second electrode 20 may be transparent electrodes, and the light-absorption layer 30, the light-absorption auxiliary layer 35, and the charge auxiliary layer 40 may be as described above. The light-absorption layer 30 and light-absorption auxiliary layer 35 may be configured to selectively absorb light in a green wavelength region and replace a color filter of a green pixel.

When light enters from the second electrode 20, the light in a green wavelength region may be mainly absorbed in the light-absorption layer 30 and the light-absorption auxiliary layer 35 and photoelectrically converted, while the light in the rest of the wavelength regions passes through the first electrode 10 and may be sensed in the photo-sensing devices 50B and 50R.

As described above, the organic photoelectronic device that is configured to selectively absorb the light of the green wavelength region is stacked, and thus an image sensor may be down-sized. As described above, the organic photoelectronic device 100 may increase green wavelength selectivity due to the light-absorption auxiliary layer 35, and may thus decrease crosstalk that is typically generated by absorbing light except in the green wavelength regions, and increase sensitivity.

Figure 4:
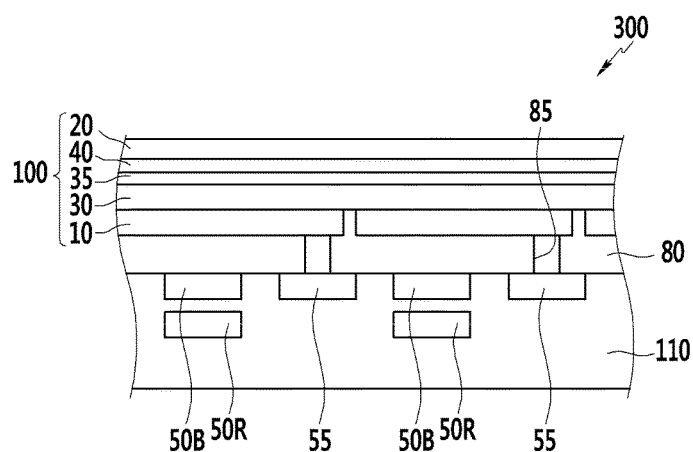
FIG. 4 is a schematic cross-sectional view of an organic CMOS image sensor according to another example embodiment.

FIG. 4 is a schematic cross-sectional view of an organic CMOS image sensor according to another example embodiment.

An organic CMOS image sensor 300 according to at least one example embodiment includes a semiconductor substrate 110 integrated with photo-sensing devices 50B and 50R, a transmission transistor (not shown), a charge storage 55, an insulation layer 80, and an organic photoelectronic device 100, similarly to the above example embodiment illustrated in FIG. 3.

However, in the organic CMOS image sensor 300 of this example embodiment, the blue photo-sensing device 50B and the red photo-sensing device 50R are stacked in a vertical direction and the color filter layer 70 may be omitted, unlike in the above example embodiment. The blue photo-sensing device 50B and the red photo-sensing device 50R are electrically connected with a charge storage (not shown), and the information sensed by the photo-sensing device may be transferred by a transmission transistor.

The blue photo-sensing device 50B and the red photo-sensing device 50R may be configured to selectively absorb light in each wavelength region depending on a stacking depth.

As described above, the organic photoelectronic device that is configured to selectively absorb the light of the green wavelength region is stacked and the red photo-sensing device and the blue photo-sensing device are stacked, and thus an image sensor may be further down-sized. As described above, the organic photoelectronic device 100 may increase green wavelength selectivity due to the light-absorption auxiliary layer 35, and thus decrease crosstalk that is generated by absorbing light except in green wavelength region, and increase sensitivity.

Figure 5:
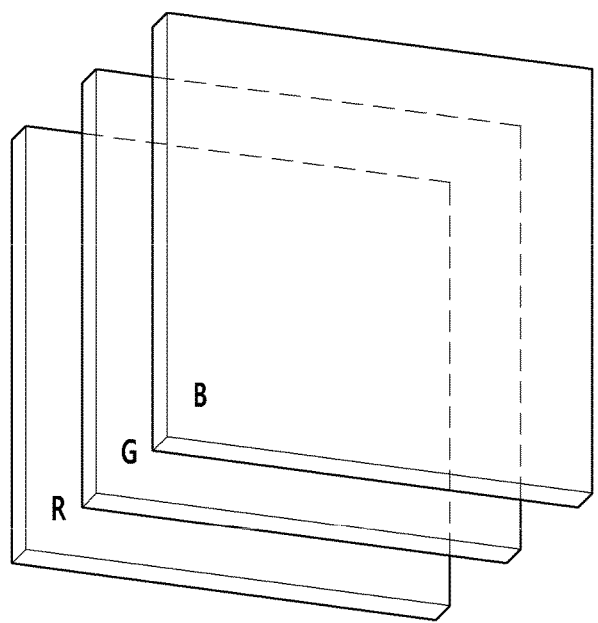
FIG. 5 is a schematic top plan view of an organic CMOS image sensor according to another example embodiment.

FIG. 5 is a top plan view schematically showing an organic CMOS image sensor according to another example embodiment.

According to the example embodiment illustrated in FIG. 5, an organic CMOS image sensor has a structure in which a green photoelectronic device that is configured to selectively absorb light in a green wavelength region, a blue photoelectronic device that is configured to selectively absorb light in a blue wavelength region, and a red photoelectronic device that is configured to selectively absorb light in a red wavelength region are stacked.

In the drawing, the red photoelectronic device, the green photoelectronic device, and the blue photoelectronic device are sequentially stacked, but the example embodiments are not limited thereto, and the red, green, and blue photoelectronic devices may be stacked in various orders.

The green photoelectronic device may be the above organic photoelectronic device 100, the blue photoelectronic device may include electrodes facing each other, a light-absorption layer interposed therebetween, and including an organic material configured to selectively absorb light in a blue wavelength region, and the red photoelectronic device may include electrodes facing each other and a light-absorption layer interposed therebetween and including an organic material configured to selectively absorb light in a red wavelength region.

As described above, an organic photoelectronic device configured to selectively absorb light in a red wavelength region, an organic photoelectronic device configured to selectively absorb light in a green wavelength region, and an organic photoelectronic device configured to selectively absorb light in a blue wavelength region are stacked, and thus may further down-size an image sensor and simultaneously increase sensitivity and decrease crosstalk.

The image sensor may be applied to various electronic devices, for example a mobile phone, a digital camera, and the like, without limitation.

Hereinafter, the example embodiments are illustrated in more detail with reference to examples but are not limited to these examples.

Manufacture of Organic Photoelectronic Device

Example 1

ITO is sputtered on a glass substrate to form an approximately 100 nm-thick lower electrode. Subsequently, molybdenum oxide (MoOx, 0≤x≤3) and aluminum (Al) in a ratio of 1:1 (wt/wt) are thermally deposited on the lower electrode to form a 5 nm-thick electron transport layer (ETL). Subsequently, on the electron transport layer ETL, a compound represented by the following Chemical Formula 1a (LumTec, LLC) as a p-type light-absorption material, and dicyanovinyl-terthiophene (DCV3T) as a n-type light-absorption material, are co-deposited in a thickness ratio of 1:1, forming a light-absorption layer. On the light-absorption layer, a compound represented by the following Chemical Formula 1a is thermally deposited to form a light-absorption auxiliary layer, and a molybdenum oxide (MoOx, 0<x≤3) is thermally deposited thereon, forming a charge auxiliary layer. On the charge auxiliary layer, ITO is sputtered to form a 100 nm-thick upper electrode, manufacturing an organic photoelectronic device.

[Chemical Formula 1a]

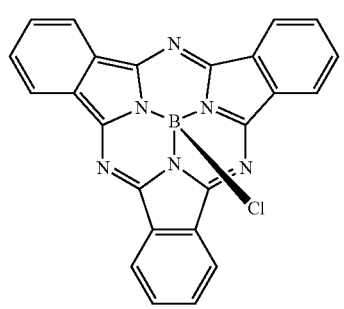

Example 2

An organic photoelectronic device is manufactured according to the same method as Example 1, except for using fullerene (C60) instead of the dicyanovinyl-terthiophene (DCV3T) as the n-type light-absorption material.

Example 3

An organic photoelectronic device is manufactured according to the same method as Example 1, except for using fullerene (C60) instead of the dicyanovinyl-terthiophene (DCV3T) as the n-type light-absorption material of the light-absorption layer, and a compound represented by the following Chemical Formula 1 b instead of the compound represented by the above Chemical Formula 1a for the light-absorption auxiliary layer.

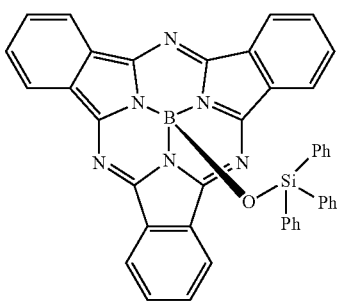

[Chemical Formula 1b]

The compound represented by the above Chemical Formula 1b is synthesized by the following method.

20.0 g of boron sub-phthalocyanine chloride, 32.0 g of triphenylsilanol, and 14.8 g of trifluoromethanesulfonic acid are heated and refluxed in 150 ml of dry toluene for 15 hours. Then, 200 ml of methylene chloride is added to the resultant, the mixture is filtered, and the filtered solution is concentrated under a reduced pressure and purified through silica gel column chromatography, obtaining a compound represented by the above Chemical Formula 1b.

Comparative Example 1

An organic photoelectronic device is manufactured according to the same method as Example 1, but the organic photoelectronic device does not have a light-absorption auxiliary layer.

Comparative Example 2

An organic photoelectronic device is manufactured according to the same method as Example 2, but the organic photoelectronic device does not have a light-absorption auxiliary layer.

Comparative Example 3

An organic photoelectronic device is manufactured according to the same method as Example 3, but the organic photoelectronic device does not have a light-absorption auxiliary layer.

Evaluation

Evaluation 1: External Quantum Efficiency (EQE) and FWHM

External quantum efficiency (EQE) and FWHM of the organic photoelectronic devices of Examples 1 to 3 and Comparative Examples 1 to 3 are evaluated depending on wavelength.

The external quantum efficiency is measured by using an IPCE measurement system. First of all, the measurement system is calibrated by using a Si photodiode and mounted on the organic photoelectronic devices according to Examples 1 to 3 and Comparative Examples 1 to 3, and their external quantum efficiency is measured in a wavelength range of about 350 to 750 nm.

The FWHM is calculated as width of a wavelength corresponding to a half of maximum external quantum efficiency ($EQE_{max}$) in the external quantum efficiency (EQE) graph.

Figure 6:
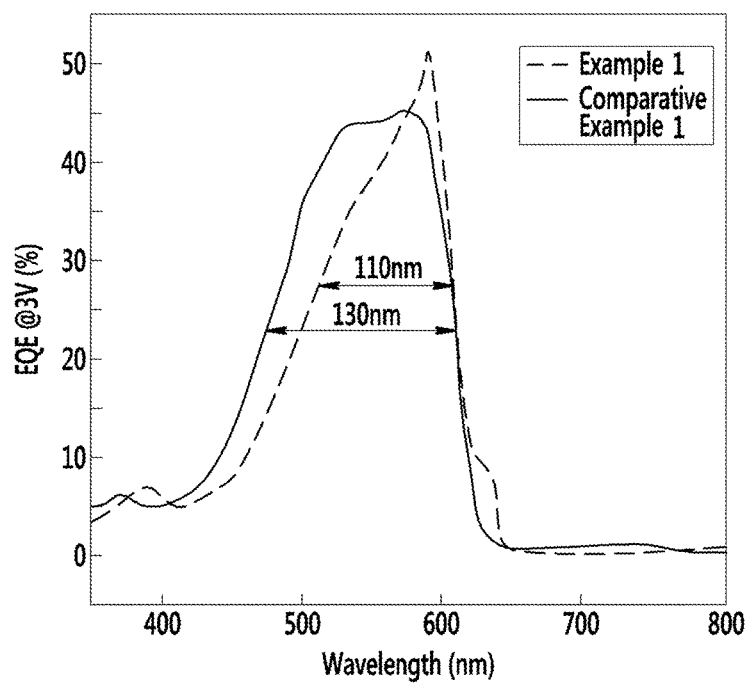
FIG. 6 is a graph showing external quantum efficiency (EQE) depending on a wavelength of organic photoelectronic devices according to Example 1 and Comparative Example 1.
Figure 7:
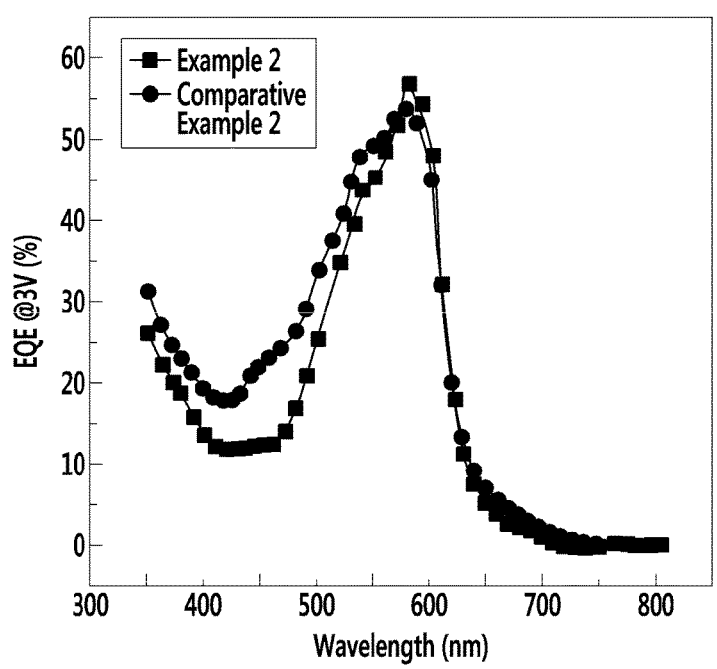
FIG. 7 is a graph showing external quantum efficiency (EQE) depending on a wavelength of an organic photoelectronic devices according to Example 2 and Comparative Example 2.
Figure 8:
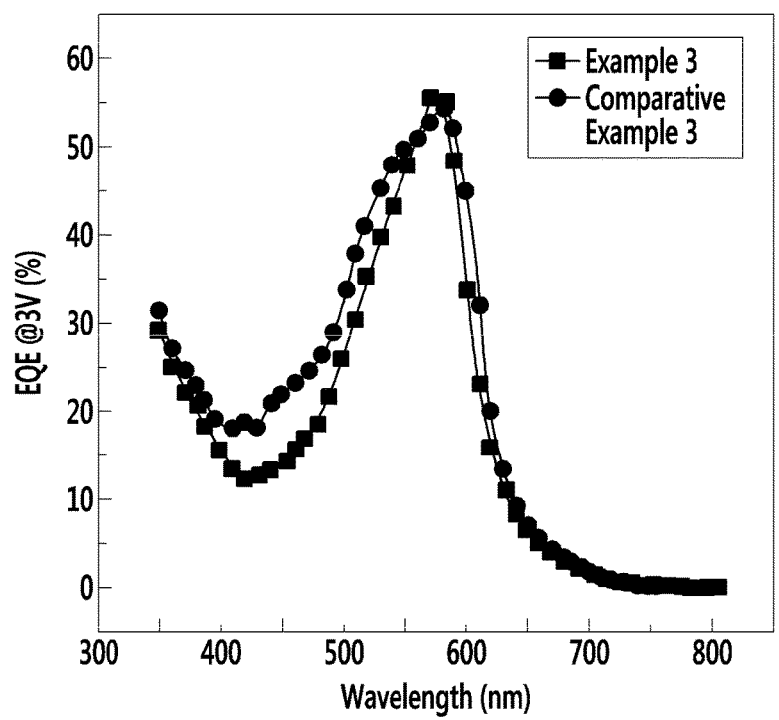
FIG. 8 is a graph showing external quantum efficiency (EQE) depending on a wavelength of organic photoelectronic devices according to Example 3 and Comparative Example 3.

The results are provided in FIGS. 6 to 8 and Table 2.

FIG. 6 is a graph showing external quantum efficiency (EQE) of the organic photoelectronic devices according to Example 1 and Comparative Example 1 depending on a wavelength, FIG. 7 is a graph showing external quantum efficiency (EQE) of the organic photoelectronic devices according to Example 2 and Comparative Example 2 depending on a wavelength, and FIG. 8 is a graph showing external quantum efficiency (EQE) of the organic photoelectronic devices according to Example 3 and Comparative Example 3 depending on a wavelength.

TABLE 2

| | Maximum absorption wavelength ($\lambda_{max}$, nm) | Maximum external quantum efficiency ($EQE_{max}$, %) | FWHM (nm) |
|---|---|---|---|
| Example 1 | 590 | 50 | 110 |
| Comparative Example 1 | 570 | 45 | 130 |
| Example 2 | 580 | 57 | 110 |
| Comparative Example 2 | 580 | 53 | 130 |
| Example 3 | 570 | 55 | 100 |
| Comparative Example 3 | 580 | 53 | 130 |

Referring to FIGS. 6 to 8 and Table 2, the organic photoelectronic device according to Example 1 shows equivalent or improved external quantum efficiency and narrowed FWHM, and thus improved wavelength selectivity compared with the organic photoelectronic device according to Comparative Example 1. Likewise, the organic photoelectronic device according to Example 2 shows equivalent or improved external quantum efficiency and narrowed FWHM, and thus improved wavelength selectivity compared with the organic photoelectronic device according to Comparative Example 2, and the organic photoelectronic device according to Example 3 shows equivalent or improved external quantum efficiency and narrowed FWHM, and thus improved wavelength selectivity compared with the organic photoelectronic device according to Comparative Example 3.

Evaluation 2: Crosstalk

Crosstalk of the organic photoelectronic devices according to Example 1 and Comparative Example 1 is evaluated.

The crosstalk evaluation is performed through simulation by using a LUMERICAL 3D program. Herein, a wavelength region is divided into three regions of about 440 to 480 nm (blue), about 520 to 560 nm (green), and about 590 to 630 nm (red), and the optical interference between two other photoelectric transformation elements of different colors in each region is evaluated. In other words, when an integral of a sensitivity curve of a blue element in the blue region of about 440 to 480 nm is regarded as 100, a relative integral of the sensitivity curves of red and green elements in the blue region of about 440 to 480 nm is calculated. The obtained value is a crosstalk of the red and green elements regarding the blue region of about 440 to 480 nm. Likewise, when an integral of a sensitivity curve in the green region of about 520 to 560 nm is regarded as 100, a relative integral of sensitivity curves of the red and blue elements in the green region of about 520 to 560 nm is calculated. This value is crosstalk regarding the green region of the red and blue elements at about 520-560 nm. Likewise, when an integral of a sensitivity curve in the red region of about 590 to 630 nm is 100, a relative integral of sensitivity curves of the blue and green elements in the red region of about 520 to 560 nm was calculated. This value is crosstalk regarding the red region of the blue and green elements at about 520 to 560 nm. Lastly, the crosstalk values are averaged to obtain an average crosstalk.

The results are provided in Table 3.

TABLE 3

|  | Average crosstalk (%) |
| --- | --- |
| Example 1 | 23 |
| Comparative Example 1 | 29 |

Referring to Table 3, the organic photoelectronic device according to Example 1 shows greater than or equal to approximately 20% decreased average crosstalk compared with the organic photoelectronic device according to Comparative Example 1.

While this disclosure has been described in connection with what is presently considered to be example embodiments, it is to be understood that the example embodiments are not limited to the disclosed embodiments, but, on the contrary, is intended to cover various modifications and equivalent arrangements included within the spirit and scope of the appended claims.

What is claimed is:

1. An organic photoelectronic device, comprising:
a first electrode and a second electrode facing each other;
a light-absorption layer between the first electrode and the second electrode, the light-absorption layer including a first p-type light-absorption material and a first n-type light-absorption material, the first p-type light-absorption material and the first n-type light-absorption material forming a heterojunction, and
a light-absorption auxiliary layer on one side of the light-absorption layer, the light-absorption auxiliary layer including a second p-type light-absorption material or a second n-type light-absorption material, the light-absorption auxiliary layer having a smaller full width at half maximum (FWHM) than the light-absorption layer.

2. The organic photoelectronic device of claim 1, wherein the second p-type light-absorption material or the second n-type light-absorption material has a smaller FWHM than a FWHM of the light-absorption layer by about 5 nm or more.

3. The organic photoelectronic device of claim 1, wherein the second p-type light-absorption material is the same as or different from the first p-type light-absorption material, and
the second n-type light-absorption material is the same as or different from the first n-type light-absorption material.

4. The organic photoelectronic device of claim 1, wherein the light-absorption auxiliary layer has an extinction coefficient that is greater than or equal to about 100,000 cm$^{-1}$ at a maximum absorption wavelength ($\lambda_{max}$).

5. The organic photoelectronic device of claim 1, wherein an external quantum efficiency (EQE) of the second p-type light-absorption material or the second n-type light-absorption material at a maximum absorption wavelength ($\lambda_{max}$) is equal to or greater than an external quantum efficiency (EQE) of the light-absorption layer at the maximum absorption wavelength ($\lambda_{max}$).

6. The organic photoelectronic device of claim 1, wherein the second p-type light-absorption material or the second n-type light-absorption material is represented by the following Chemical Formula 1, and
the first p-type light-absorption material or the first n-type light-absorption material is represented by the following Chemical Formula 2:

[Chemical Formula 1]

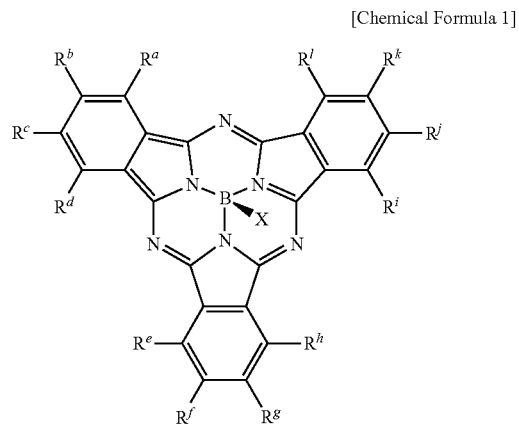

wherein
$R^a$ to $R^l$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof,
X is a halogen atom, a halogen-containing group, a substituted or unsubstituted C1 to C30 alkyl group, a substituted or unsubstituted C6 to C30 aryl group, a substituted or unsubstituted C1 to C30 alkoxy group, a substituted or unsubstituted C1 to C30 aryloxy group, a substituted or unsubstituted C1 to C30 heteroaryloxy group, a substituted or unsubstituted silyloxy group, a substituted or unsubstituted amine group, a substituted or unsubstituted arylamine group, or a combination thereof,

[Chemical Formula 2]

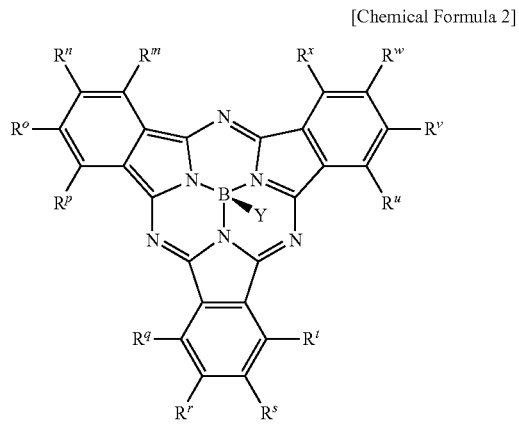

wherein
$R^m$ to $R^x$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and
Y is a halogen atom.

7. An organic photoelectronic device, comprising:
a light-receiving electrode and an opposing electrode,
a light-absorption layer between the light-receiving electrode and the opposing electrode, and
a light-absorption auxiliary layer between the light-receiving electrode and the opposing electrode,
wherein the light-absorption auxiliary layer includes a light-absorption material configured to absorb light in a visible wavelength region.

8. The organic photoelectronic device of claim 7, wherein the light-absorption layer and the light-absorption auxiliary layer are configured to absorb light in a green wavelength region.

9. The organic photoelectronic device of claim 8, wherein a FWHM of the light-absorption auxiliary layer is narrower than a FWHM of the light-absorption layer.

10. The organic photoelectronic device of claim 7, wherein the light-absorption material of the light-absorption auxiliary layer is represented by the following Chemical Formula 1:

[Chemical Formula 1]

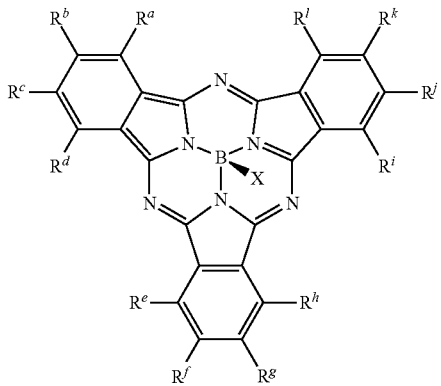

wherein
$R^a$ to $R^l$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and X is a halogen atom, a halogen-containing group, a substituted or unsubstituted C1 to C30 alkyl group, a substituted or unsubstituted C6 to C30 aryl group, a substituted or unsubstituted C1 to C30 alkoxy group, a substituted or unsubstituted C1 to C30 aryloxy group, a substituted or unsubstituted C1 to C30 heteroaryloxy group, a substituted or unsubstituted silyloxy group, a substituted or unsubstituted amine group, a substituted or unsubstituted arylamine group, or a combination thereof.

11. The organic photoelectronic device of claim 7, further comprising a charge auxiliary layer between the light receiving electrode and the opposing electrode.

12. An organic photoelectronic device, comprising:
a first electrode and a second electrode facing each other;
a light-absorption layer between the first electrode and the second electrode, the light-absorption layer including a first p-type light-absorption material and a first n-type light-absorption material, the first p-type light-absorption material and the first n-type light-absorption material forming a heterojunction, and
a light-absorption auxiliary layer on one side of the light-absorption layer,
wherein a FWHM of the light-absorption auxiliary layer is narrower than a FWHM of the light-absorption layer.

13. The organic photoelectronic device of claim 12, wherein the light-absorption auxiliary layer has a FWHM that is less than or equal to about 90 nm.

14. The organic photoelectronic device of claim 12, further comprising a charge auxiliary layer on one side of the light-absorption auxiliary layer.

15. An image sensor comprising the organic photoelectronic device of claim 1.

16. An electronic device including the image sensor of claim 15.

17. An image sensor comprising the organic photoelectronic device of claim 7.

18. An electronic device including the image sensor of claim 17.

19. An image sensor comprising the organic photoelectronic device of claim 12.

20. An electronic device including the image sensor of claim 19.

* * * * *